(12) United States Patent
Zhang et al.

(10) Patent No.: US 7,335,950 B2
(45) Date of Patent: Feb. 26, 2008

(54) SEMICONDUCTOR DEVICE AND METHOD OF MAKING THEREOF

(75) Inventors: Hongyong Zhang, Kanagawa (JP); Satoshi Teramoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 119 days.

(21) Appl. No.: 10/959,981

(22) Filed: Oct. 8, 2004

(65) Prior Publication Data

US 2005/0056849 A1 Mar. 17, 2005

Related U.S. Application Data

(60) Continuation of application No. 10/309,488, filed on Dec. 3, 2002, now Pat. No. 6,831,333, which is a division of application No. 09/749,862, filed on Dec. 26, 2000, now Pat. No. 6,498,060, which is a division of application No. 08/820,845, filed on Mar. 20, 1997, now Pat. No. 6,180,982.

(30) Foreign Application Priority Data

Mar. 21, 1996 (JP) ............................. 08-092009

(51) Int. Cl.
*H01C 29/04* (2006.01)

(52) U.S. Cl. ............. 257/347; 257/348; 257/349; 257/350; 257/351; 257/352; 257/353; 257/55; 257/56; 257/59; 257/65

(58) Field of Classification Search .............. 257/347, 257/348, 349, 350, 351, 352, 353, 55, 56, 257/59, 65

See application file for complete search history.

(56) References Cited

U.S. PATENT DOCUMENTS

| | | | |
|---|---|---|---|
| 5,172,202 A | * | 12/1992 | Kazuo |
| 5,200,846 A | | 4/1993 | Hiroki et al. |
| 5,287,205 A | | 2/1994 | Yamazaki et al. |
| 5,292,675 A | | 3/1994 | Codama |
| 5,308,998 A | | 5/1994 | Yamazaki et al. |
| 5,414,442 A | | 5/1995 | Yamazaki et al. |
| 5,453,858 A | | 9/1995 | Yamazaki |

(Continued)

FOREIGN PATENT DOCUMENTS

JP 07-037994 2/1995

(Continued)

*Primary Examiner*—Long Pham
(74) *Attorney, Agent, or Firm*—Fish & Richardson P.C.

(57) ABSTRACT

To provide a thin film transistor having a low OFF characteristic and to provide P-channel type and N-channel type thin film transistors where a difference in characteristics of the P-channel type and the N-channel type thin film transistors is corrected, a region 145 having a P-type behavior more potential than that of a drain region 146 is arranged between a channel forming region 134 and the drain region 146 in the P-channel type thin film transistor whereby the P-channel type thin film transistor having the low OFF characteristic can be provided and a low concentration impurity region 136 is arranged between a channel forming region 137 and a drain region 127 in the N-channel type thin film transistor whereby the N-channel type thin film transistor having the low OFF characteristic and where deterioration is restrained can be provided.

10 Claims, 7 Drawing Sheets

U.S. PATENT DOCUMENTS

| | | | |
|---|---|---|---|
| 5,485,019 A * | 1/1996 | Yamazaki et al. | |
| 5,495,353 A | 2/1996 | Yamazaki et al. | |
| 5,508,216 A * | 4/1996 | Inoue | |
| 5,514,879 A | 5/1996 | Yamazaki | |
| 5,521,107 A | 5/1996 | Yamazaki et al. | |
| 5,563,427 A | 10/1996 | Yudasaka et al. | |
| 5,568,288 A | 10/1996 | Yamazaki et al. | |
| 5,600,170 A * | 2/1997 | Sugiyama et al. | |
| 5,604,145 A * | 2/1997 | Hashizume et al. | |
| 5,612,799 A | 3/1997 | Yamazaki et al. | |
| 5,614,732 A | 3/1997 | Yamazaki | |
| 5,701,167 A | 12/1997 | Yamazaki | |
| 5,713,764 A * | 2/1998 | Brunker et al. | |
| 5,764,206 A | 6/1998 | Koyama et al. | |
| 5,767,930 A * | 6/1998 | Kobayashi et al. | |
| 5,777,701 A | 7/1998 | Zhang | |
| 5,784,073 A | 7/1998 | Yamazaki et al. | |
| 5,814,529 A | 9/1998 | Zhang | |
| 5,821,563 A | 10/1998 | Yamazaki et al. | |
| 5,828,433 A * | 10/1998 | Shin | 349/147 |
| 5,849,601 A | 12/1998 | Yamazaki | |
| 5,859,445 A | 1/1999 | Yamazaki | |
| 5,864,151 A | 1/1999 | Yamazaki et al. | |
| 5,899,547 A | 5/1999 | Yamazaki et al. | |
| 5,905,555 A | 5/1999 | Yamazaki et al. | |
| 5,913,112 A | 6/1999 | Yamazaki et al. | |
| 5,929,948 A | 7/1999 | Ohori et al. | |
| 5,933,205 A | 8/1999 | Yamazaki et al. | |
| 5,940,732 A | 8/1999 | Zhang | |
| 5,946,059 A | 8/1999 | Yamazaki et al. | |
| RE36,314 E | 9/1999 | Yamazaki et al. | |
| 5,949,107 A | 9/1999 | Zhang | |
| 5,956,105 A * | 9/1999 | Yamazaki et al. | 349/43 |
| 5,962,870 A * | 10/1999 | Yamazaki et al. | |
| 5,963,278 A | 10/1999 | Yamazaki et al. | |
| 5,985,701 A | 11/1999 | Takei et al. | |
| 6,011,277 A | 1/2000 | Yamazaki | |
| 6,011,607 A * | 1/2000 | Yamazaki et al. | |
| 6,013,928 A * | 1/2000 | Yamazaki et al. | |
| 6,146,930 A * | 11/2000 | Kobayashi et al. | |
| 6,175,395 B1 | 1/2001 | Yamazaki et al. | |
| 6,180,982 B1 * | 1/2001 | Zhang et al. | 257/347 |
| 6,198,517 B1 | 3/2001 | Ohori et al. | |
| 6,219,118 B1 | 4/2001 | Zhang | |
| 6,246,399 B1 | 6/2001 | Yamane et al. | |
| 6,246,454 B1 | 6/2001 | Koyama et al. | |
| 6,251,712 B1 | 6/2001 | Tanaka et al. | |
| 6,320,224 B1 | 11/2001 | Zhang | |
| 6,396,471 B1 | 5/2002 | Hirakata | |
| 6,498,060 B2 * | 12/2002 | Zhang et al. | 438/154 |
| 6,587,169 B1 | 7/2003 | Yamazaki et al. | |
| 6,614,052 B1 | 9/2003 | Zhang | |
| 6,831,333 B2 * | 12/2004 | Zhang et al. | |
| 6,838,698 B1 | 1/2005 | Yamazaki et al. | |
| 6,844,868 B2 | 1/2005 | Hirakata | |
| 6,900,855 B1 | 5/2005 | Yamazaki et al. | |
| 6,982,768 B2 | 1/2006 | Ohori et al. | |
| 7,023,518 B1 | 4/2006 | Koyama et al. | |
| 2001/0035919 A1 | 11/2001 | Zhang | |
| 2002/0008795 A1 | 1/2002 | Koyama et al. | |
| 2002/0055206 A1 | 5/2002 | Zhang | |
| 2003/0201437 A1 | 10/2003 | Zhang | |
| 2005/0099557 A1 | 5/2005 | Zhang | |
| 2005/0104065 A1 | 5/2005 | Yamazaki et al. | |
| 2005/0122320 A1 | 6/2005 | Hirakata | |
| 2005/0206797 A1 | 9/2005 | Yamazaki et al. | |
| 2005/0287722 A1 | 12/2005 | Zhang | |

FOREIGN PATENT DOCUMENTS

| | | |
|---|---|---|
| KR | 1995-0033580 | 12/1995 |
| KR | 1997-0030930 | 6/1997 |

* cited by examiner

SEMICONDUCTOR DEVICE AND METHOD OF MAKING THEREOF

CROSS-REFERENCE TO RELATED APPLICATIONS

This application is a continuation application of U.S. application Ser. No. 10/309,488, filed Dec. 3, 2002, now U.S. Pat. No. 6,831,333 now allowed, which is a divisional of U.S. application Ser. No. 09/749,862, filed Dec. 26, 2000, now U.S. Pat. No. 6,498,060, which is a divisional of U.S. application Ser. No. 08/820,845, filed Mar. 20, 1997, now U.S. Pat. No. 6,180,982, which claims the benefit of a foreign priority application filed in Japan as Ser. No. 08-092009 on Mar. 21, 1996. This application claims priority to each of these prior applications, and the disclosures of the prior applications are considered part of (and are incorporated by reference in) the disclosure of this application.

BACKGROUND OF THE INVENTION

1. Field of the Invention

The present invention disclosed in the specification relates to a thin film transistor and a method of making thereof. Further, the present invention relates to a method of making a display device of an active matrix type utilizing thin film transistors.

2. Description of Related Art

A thin film transistor has been known as a device for constituting an active matrix type liquid crystal display device. Particular attention is being paid to technologies utilizing a thin film transistor using a silicon thin film having crystallinity.

A thin film transistor using a silicon film having crystallinity is characterized in that a high speed operation is feasible and a CMOS (Complementary Metal Oxide Semiconductor) circuit can be constituted.

When a thin film transistor using a silicon thin film having crystallinity is used, an active matrix circuit and peripheral drive circuits for driving the active matrix circuit can be integrated on one sheet of a glass substrate (or quartz substrate) by making use of such a characteristic.

However, a crystalline silicon thin film provided in the current technology is not in a single crystal state but in a polycrystal state or a microcrystal state. Defects or impurities are included in such a film (referred to as crystalline silicon film) at a comparatively high level. Accordingly, there poses a problem where the structure of a bonded portion of different conductive materials is electrically inferior. The problem gives rise to a factor causing an aging change (generally amountable to deterioration) of an OFF current or properties in the operation of a thin film transistor.

For example, the problem where the OFF current (a current made to flow between a source and a drain in the OFF operation) is comparatively large is a problem common to thin film transistors of a P-channel and an N-channel type. Furthermore, the mobility of carriers in the P-channel type thin film transistor is lower than that of carriers of the N-channel type one. Also, there poses a problem in the N-channel type transistor where deterioration by hot carriers (deterioration thereof particularly at a bonded portion) is significant.

It is preferable to attain simultaneous resolution of the above-described problems when an integrated circuit using thin film transistors are constituted. Especially, when P-channel type and N-channel type transistors are simultaneously formed (separately formed) on a same substrate, a difference in characteristics between the P-channel type transistors and the N-channel type ones needs to correct.

The reason is that a circuit, (generally constituted based on a CMOS circuit) having excellent characteristics cannot be obtained when only the N-channel transistor or the P-channel transistor is provided with a low OFF current characteristic or is provided with a high mobility.

It is a problem of the present invention disclosed in the specification to provide a thin film transistor having a low OFF current value. Also, it is a problem thereof to provide thin film transistors of a P-channel type and an N-channel type where the difference in characteristics is corrected.

SUMMARY OF THE INVENTION

According to one aspect of the present invention disclosed in the specification, as illustrated in a specific constitution example of FIG. 4, there is provided a semiconductor device which is a P-channel type thin film transistor having a channel forming region 140 and a drain region 150, wherein an impurity region 149 having a stronger P-type characteristics than the drain region is arranged between the channel forming region and the drain region.

The low OFF current characteristic can be obtained by arranging the impurity region 149 having the stronger P-type characteristics. The P-type behavior more potential than the P-type behavior of the drain region 150 signifies that the impurity region 149 is provided with the property as a P-type semiconductor more potential than that of the drain region 150. The intensity of the property as the P-type semiconductor can be compared by a hole density (density of majority carriers) or conductance. That is, the P-type semiconductor having a high hole density and a high conductance has the stronger property as a P-type semiconductor. In FIG. 4, the relative degree of the intensity of the property as the P-type semiconductor is designated by notations P+ or P++.

In the above-described constitution, an impurity providing an N-type behavior is included in the region 149 and the drain region 150. This is because an impurity providing the N-type behavior is simultaneously implanted in forming an N-channel type thin film transistor as illustrated by FIGS. 3(A) and 3(B).

As is apparent in reference to FIGS. 3(A) and 3(B), the concentration of the impurity providing the N-type behavior that is included in the region 149 having the potential P-type behavior is smaller than the concentration of the impurity providing the N-type behavior that is included in the drain region 150.

Also, as illustrated in FIG. 4, the impurity ions for providing the P-type behavior are simultaneously implanted to the region 149 and the region 150 and therefore, the region 149 having the potential P-type behavior and the drain region 150 include the impurity providing the P-type behavior by concentrations substantially the same as each other.

According to another aspect of the present invention, as illustrated by a specific constitution example of FIG. 4, there is provided a semiconductor device which is a P-channel type thin film transistor having a channel forming region 140 and a drain region 150, wherein the drain region 150 includes an impurity providing an N-type behavior, a region 149 including the impurity providing the N-type behavior by a concentration lower than that of the drain region 150 is arranged between the channel forming region 140 and the drain region 150, and the region 149 including the impurity providing the N-type behavior by the concentration lower than that of the drain region 150, is provided with the P-type behavior more potential than that of the drain region 150.

According to another aspect of the present invention, as illustrated by a specific constitution example of FIG. 4, there is provided a semiconductor device where a P-channel type and an N-channel type thin film transistor are formed on a same substrate, an impurity region 145 having a P-type behavior more potential than that of the drain region is arranged between a channel forming region 134 and a drain region 146 in the P-channel type thin film transistor, and a low concentration impurity region 136 including the impurity providing the N-type behavior by a concentration lower than that of a drain region 127 is arranged between a channel forming region 137 and the drain region 127 in the N-channel type thin film transistor.

Although an example using a glass substrate is shown in FIG. 4, the above-described constitution can be utilized to a substrate having other insulating surface and an integrated circuit having a multilayered structure.

In the above structure, the impurity region 145 having the potential P-type behavior include the impurity providing the N-type behavior by a concentration substantially the same as that of the low concentration impurity region 136, a source and a drain region 143 and 146 of the P-channel type thin film transistor, include the impurity providing the N-type behavior by a concentration substantially the same as those of a source and a drain region 129 and 127 of the N-channel type thin film transistor, and the impurity region 145 having the potential P-type behavior and the source and the drain regions 143 and 146 of the P-channel type thin film include the impurity providing the P-type behavior by substantially the same concentrations.

In the above-described constitution, the low concentration impurity region designated by numeral 136 of the N-channel type thin film transistor is a region generally referred to as an LDD (Light Dope Drain) region. According to another aspect of the present invention, as illustrated by a specific constitution example of FIG. 4, there is provided a semiconductor device where a P-channel type thin film transistor and an N-channel type thin film transistor are formed on a same substrate, a region 145 including the impurity providing the P-type behavior by a concentration substantially the same as that of a drain region 146 and having the P-type behavior more potential than that of the drain region 146 is formed between a channel forming region 134 and the drain region 146 in the P-channel type thin film transistor, and a low concentration impurity region 136 including the impurity providing the N-type behavior by a concentration lower than that of a drain region 127 is arranged between a channel forming region 137 and the drain region 127 in the N-channel type thin film transistor.

According to another aspect of the present invention, as illustrated by a specific constitution example of FIG. 4, there is provided a semiconductor device having the constitution where an active matrix circuit (in which a P-channel type thin film transistor on the right is arranged) and a peripheral drive circuit (in which a P-channel and an N-channel type thin film transistor on the left are arranged) for driving the active matrix circuit, are integrally arranged, where a P-channel type thin film transistor is arranged in the active matrix circuit, a P-channel type and an N-channel type thin film transistor are arranged at the peripheral drive circuit, impurity regions having a P-type behavior more potential than that of drain regions are arranged between channel forming regions and the drain regions of the P-channel type thin film transistors, and a low concentration impurity region 136 including the impurity providing the N-type behavior by a concentration lower than that of a drain region 127 is arranged between a channel forming region 137 and the drain region 127.

In the above-described constitution, the channel forming regions of the P-channel type thin film transistors are designated by numerals 134 and 140. The drain regions of the P-channel type thin film transistor are designated by numerals 146 and 150. Further, the impurity regions having the P-type behavior more potential than those of the drain regions of the P-channel type thin film transistor are designated by numerals 145 and 149.

According to another aspect of the present invention, as illustrated by a specific constitution example of FIG. 7, there is provided a semiconductor device where a P-channel type thin film transistor and N-channel type thin film transistors are formed on a same substrate, an impurity region having the P-type behavior more potential than a drain region is arranged between a channel forming region and the drain region in the P-channel type thin film transistor, and offset gate regions are arranged between channel forming regions and drain regions in the N-channel type thin film transistors.

According to another aspect of the present invention, as illustrated by fabrication steps of FIG. 1(A) through FIG. 5(B), there is provided a method of making a semiconductor including the steps of forming a thin film semiconductor on a substrate (FIG. 1(A)), forming active layers 104 through 106 of P-channel type thin film transistors and an N-channel type thin film transistor by using the thin film semiconductor (FIG. 1(B)), forming N-type regions 124, 126, 127, 129, 130 and 132 and low concentration impurity regions 133, 135, 136, 138, 139 and 141 added with the impurity providing the N-type behavior by a concentration lower than that of the N-type regions in a total of the active layers (FIGS. 3(A) and 3(B)) and adding the impurity providing the P-type behavior to the N-type regions and the low concentration impurity regions in the active layers constituting the P-channel type thin film transistors (FIG. 4).

According to another aspect of the present invention, as illustrated by fabrication steps of FIG. 1(A) through FIG. 5(B), there is provided a method of making a semiconductor including the steps of forming a plurality of regions 124, 126, 127, 129, 130 and 132 having the N-type behavior by adding the impurity providing the N-type behavior to semiconductor thin films (FIG. 3(A)), forming a plurality of low concentration impurity regions 133, 135, 136, 138, 139 and 141 including the impurity providing the N-type behavior by a concentration lower than that of the regions having the N-type behavior by adding the impurity providing the N-type behavior by a concentration lower than that in the preceding step (FIG. 3(B)), and inverting at least portions of the plurality of regions having the N-type behavior into regions having the P-type behavior and simultaneously inverting at least portions of the plurality of low concentration impurity regions into regions having the P-type behavior more potential than that of the regions inverted to have the P-type behavior by selectively adding the impurity providing the P-type behavior.

According to another aspect of the present invention, as illustrated by fabrication steps of FIG. 1(A) through FIG. 5(B), there is provided a method of making a P-channel type thin film transistor comprising the step of adding the impurity providing the P-type behavior to a semiconductor film having regions 130 and 132 having an N-type behavior and low concentration impurity regions 139 and 141 including the impurity providing the N-type behavior by a concentration lower than that of the regions 130 and 132 (refer to FIGS. 3(A) and 3(B)) whereby the regions 130 and. 132 having the N-type behavior are inverted to provide the P-type behavior to thereby form source and drain regions 147 and 150 and whereby the low concentration impurity regions 139 and 141 are simultaneously inverted to regions 148 and 149 having the P-type behavior more potential than that of the source and drain regions (FIG. 4) by which the region 149 having the potential P-type behavior is arranged between the source region 150 and a channel forming region 140.

According to the present invention disclosed in the specification, the shape of the active layers is not limited to the one that is patterned linearly. For example, the shape of the active layers may be that of a channel type one, an angle type one, or ones having complicated shapes.

Further, although a planer type thin film transistor is mainly shown in the specification, the present invention disclosed in the specification may be utilized also in the stagger type or the inverse stagger type.

The present invention disclosed in the specification is applicable not only to an active matrix type liquid crystal display device but to other active matrix type flat panel displays.

Additionally, the present invention disclosed in the specification can be utilized to the constitution of thin film transistors arranged in an integrated circuit having a multilayers structure, or a circuit using thin film transistors arranged in an integrated circuit having a multilayered structure.

As illustrated by FIG. 4, according to the P-channel type thin film transistor, the region 144 having the P-type behavior more potential than that of the drain region 146 is arranged between the channel forming region 134 and the drain region 146. In this way the P-channel type thin film transistor having the low OFF characteristic can be provided.

Also, according to the N-channel type thin film transistor, the low concentration impurity region 138 is arranged between the channel forming region 137 and the drain region 127. In this way, the N-channel type thin film transistor having the low OFF characteristic and where deterioration is restrained can be provided.

DETAILED DESCRIPTION OF THE PREFERRED EMBODIMENTS

Embodiment 1

FIG. 1(A) through FIG. 5(B) show steps of making thin film transistors according to Embodiment 1. The disclosure in Embodiment 1 are steps of making simultaneously on a same glass substrate a peripheral drive circuit portion and an active matrix circuit (pixel matrix circuit) portion of an active matrix type liquid crystal display device. In FIG. 1(A) through FIG. 5(B), steps of making a CMOS circuit constituting a peripheral drive circuit are shown on the left of the drawings. Steps of making a P-channel type thin film transistor arranged in the active matrix circuit are shown on the left of the drawings.

Incidentally, numerical values and conditions in the following fabrication steps show only one example. That is, these numerical values or conditions can be changed or optimized as necessary and are not limited to the described values.

Firstly, a silicon oxide film is formed as an underlayer film 102 on a glass substrate (or a quartz substrate) 101 by a thickness of 3000 Å. A sputtering process is used as the method of forming the silicon oxide film.

Next, an amorphous silicon film 103 is formed on the underlayer film 102 by a thickness of 1000 Å through a plasma CVD (Chemical Vapor Deposition) process. A low pressure thermal CVD process may be used as a method of forming the amorphous silicon film. According to Embodiment 1, the amorphous silicon film 103 is an intrinsic semiconductor or substantially intrinsic (I type) semiconductor where no impurity providing a conductive behavior is not particularly added. Incidentally, impurities such as phosphorous and boron may be added in forming the amorphous silicon film 103 by a small amount to control the characteristics of the finished thin film transistors.

Figure 1A:
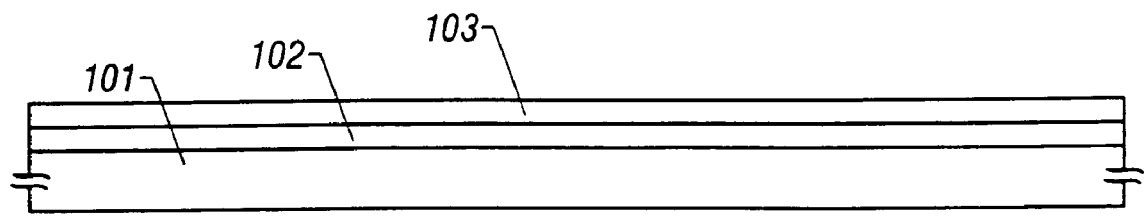
FIGS. 1(A), 1(B) and 1(C) are views showing steps of simultaneously making an active matrix circuit and a peripheral drive circuit.

Thus, the state illustrated by FIG. 1(A) is provided. Next, the amorphous silicon film 103 is made to crystallize by performing a heating treatment. As a method of crystallization, irradiation of a laser beam, lamp annealing or methods using both these processes and a heating treatment may be utilized.

When the amorphous silicon film 103 has been crystallized, the films are patterned whereby island-like regions designated by numerals 104, 105 and 106 are formed. The region 104 is to be an active layer of a P-channel type thin film transistor constituting the CMOS circuit in later steps. The region 105 is to be an active layer of an N-channel type thin film transistor constituting the CMOS circuit in later steps. The region 106 is to be an active layer of an P-channel type thin film transistor arranged in the pixel matrix circuit in later steps.

Figure 1B:
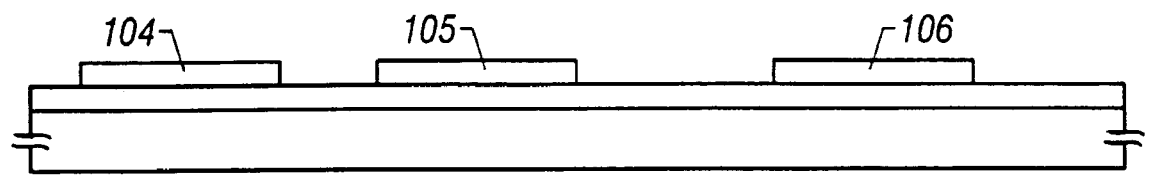

Thus, the state illustrated by FIG. 1(B) is provided. Next, an aluminum layer 107 is formed by a thickness of 5000 Å through a sputtering process. The aluminum film 107 is made to include 0.1 through 0.2 weight % of scandium (or yttrium) to restrain occurrence of hillocks or whiskers caused by abnormal growth of aluminum in later steps. (FIG. 1(C))

Hillocks or whiskers are acicular or thorny projections formed by the abnormal growth of aluminum in accordance with heating processes.

After forming the aluminum film 107, an anodically oxidized film 108 having a dense film quality is formed. The formation of the anodically oxidized film 108 having the dense film quality is conducted by using an ethylene glycol solution including 3% tartaric acid as an electrolysis solution. That is, the anodically oxide film 108 is formed by making an anodic oxidation current flow in the electrolysis solution with the aluminum film 107 as an anode and platinum as a cathode.

Here, the film thickness of the anodically oxidized film 108 is made substantially 100 Å by controlling the applied voltage.

The anodically oxidized film 108 functions to promote the adherence of a resist mask that is to be arranged in later steps.

Figure 1C:
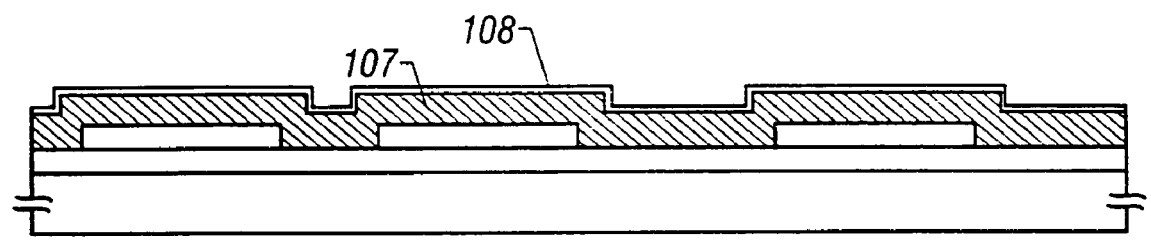
Figure 2A:
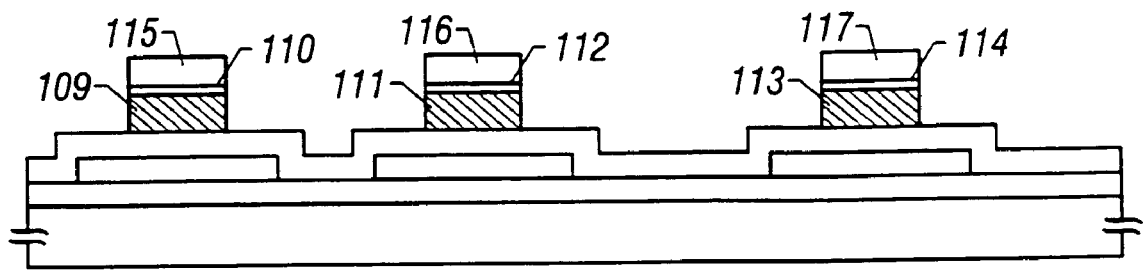
FIGS. 2(A), 2(B) and 2(C) are views showing steps of simultaneously making an active matrix circuit and a peripheral drive circuit.

Thus, the state illustrated by FIG. 1(C) is provided. Next, resist masks 115, 116 and 117 are arranged as shown by FIG. 2(A) and the aluminum film 107 is patterned. In this case, caution is required since the patterning of the aluminum film 107 is made difficult if the film thickness of the anodically oxidized film 108 is thick.

In FIG. 2(A), aluminum portions 109, 111 and 113 constitute an aluminum pattern respectively constituting (becoming bases) of gate electrodes. Further, film portions 110, 112 and 114 are anodically oxidized films having the dense film quality remaining on the aluminum pattern.

When the state as illustrated by FIG. 2(A) is provided, the anodic oxidation is conducted again. Here, porous anodically oxidized films designated by numerals 118, 119 and 120 are formed.

In this step an aqueous solution including 3% oxalic acid is used as an electrolysis solution. Further, the anodic oxidation is carried out with the aluminum patterns designated by numerals 109, 111 and 113 as anodes and platinum as a cathode in the electrolysis solution.

The anodic oxidation is progressed in this step at side faces of the aluminum patterns 109, 111 and 113 since the resist masks 115, 116 and 117 and further the dense anodically oxidized films 110, 112 and 114 are present.

Figure 2B:
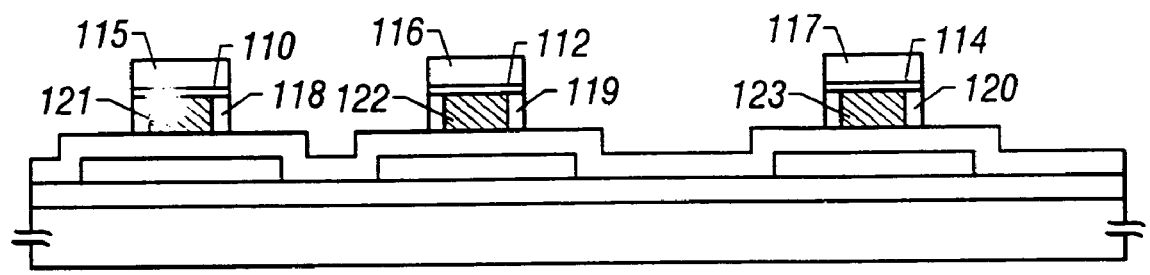

In this way, the porous anodically oxidized films are formed at portions designated by numerals 118, 119 and 120 in FIG. 2(B). The porous anodically oxidized films can be controlled by an anodic oxidation time period.

Here, the porous anodically oxidized films 118, 119 and 120 are formed by a thickness of 5000 Å. The porous anodically oxidized films are utilized in forming low concentration impurity regions (LDD region) and impurity regions having a P-type behavior.

When the state illustrated by FIG. 2(B) is provided, the resist masks 115, 116 and 117 are removed by an exclusively-used remover. Further, the anodic oxidation is carried out again with a condition of forming an anodically oxidized film having a dense film quality.

As a result, anodically oxidized films having a dense film quality designated by numerals 11, 12 and 13 are formed. Here, the anodically oxidized films designated by numerals 11 through 13 are formed in a state where they are integrated to the previously formed anodically oxidized films 110, 112 and 114. (FIG. 2(C)).

Figure 2C:
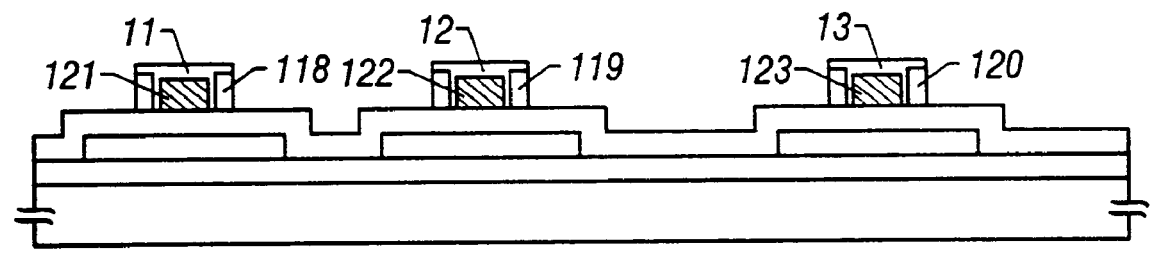

In this step, the electrolysis solution invades the inside of the porous anodically oxidized films 118 through 120 and accordingly, the anodically oxidized films having the dense film quality designated by numeral 11 through 13 of FIG. 2(C) are formed.

Incidentally, the film thicknesses of the anodically oxidized films 11, 12 and 13 having the dense film quality are made 1000 Å. These anodically oxidized films have a function of electrically and mechanically protect the surfaces of the gate electrodes (gate wirings extended therefrom). Specifically, they have a function of promoting electric insulation performance and restraining occurrence of hillocks or whiskers.

In the step illustrated by FIG. 2(C), the gate electrodes 121 and 123 of a P-channel type thin film transistor and the gate electrode 122 of an N-channel type thin film transistor are established.

When the state illustrated by FIG. 2(C) is provided, phosphorous ions are implanted. In this step, the implantation of phosphorous ions are carried out by an amount of doze for forming source and drain regions. The implantation of phosphorous ions is carried out by a publicly-known plasma doping process. Other doping processes may be utilized. (FIG. 3(A))

In this step, phosphorous ions are implanted to regions 124, 126, 127, 129, 130 and 132 by a comparatively high concentration. The amount of doze in this step is made $1 \times 10^{15}/cm^2$. The acceleration voltage of ions is made 80 kV. Incidentally, the expression of N+ or N− designated in the drawings hereinafter indicates a case where a relative intensity of a conductive type due to a difference in relative concentrations is shown or a case where the relative intensity of the conductive type is simply shown.

For example, the intensity of the conductive type may differ in correspondence with the impurity concentration or may differ by a difference in a ratio of impurities contributing to formation of the conductiveness even with the same impurity concentration.

Figure 3A:
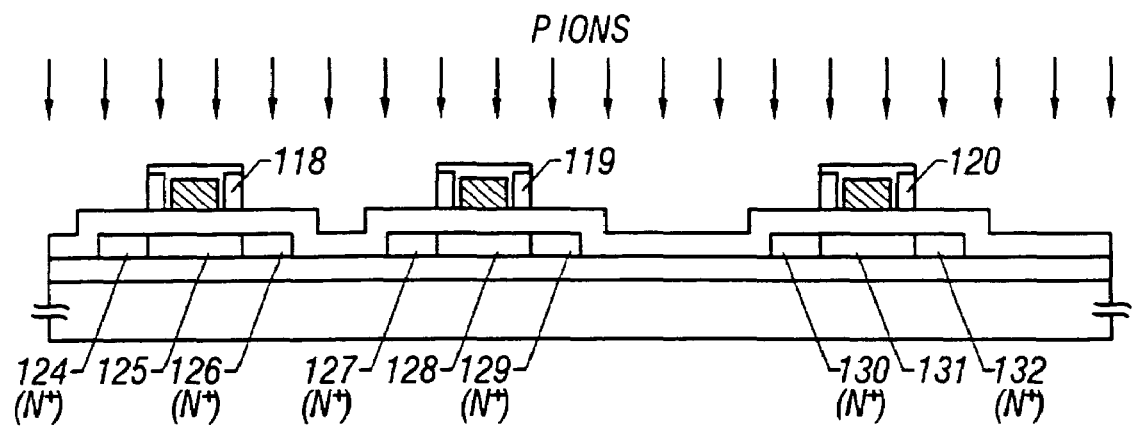
FIGS. 3(A) and 3(B) are views showing steps of simultaneously making an active matrix circuit and a peripheral drive circuit.

In the implantation step of phosphorous ions illustrated by FIG. 3(A), phosphorous ions are not implanted in regions 125, 128 and 131. Therefore, the intrinsic state or the substantially intrinsic state is maintained as it is.

When the implantation of phosphorous ions shown by FIG. 3(A) has been finished, the porous anodically oxidized films 118, 119 and 120 are removed by using a mixed acid mixed with phosphoric acid, acetic acid and nitric acid.

Figure 3B:
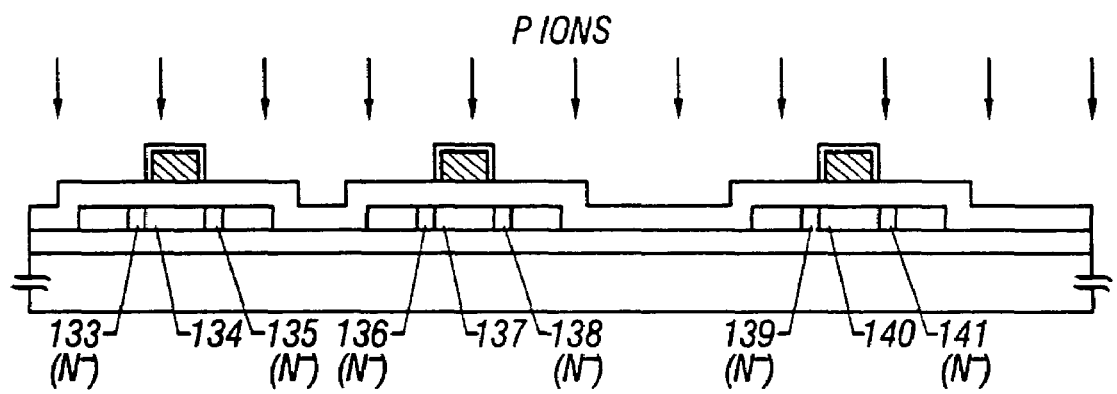

Next, the implantation of phosphorous ions is carried out again as shown by FIG. 3(B). In this step, the implantation of phosphorous ions is carried out by an amount of doze lower than the amount of doze in the step of FIG. 3(A). Here, the amount of doze is made 0.5 through $1 \times 10^{14}/cm^2$. Further, the acceleration voltage of ions is made 70 kV.

As a result of this step, regions designated by numerals 133, 135, 136, 138, 139 and 141 become N− type (weak N type) regions, That is, phosphorous ions are added thereto by a concentration lower than that of the regions 124, 126, 127, 129, 130 and 132 whereby the regions 133, 135, 136, 138, 139 and 141 become the low concentration impurity regions. (FIG. 3(B))

Then, the regions 134, 137 and 140 directly below gate electrodes are determined as the channel forming regions. Although in Embodiment 1 the channel forming regions 134, 137 and 140 are an intrinsic or substantially intrinsic semiconductors, a small amount of impurities may be added to the channel forming regions 134, 137 and 140 for controlling characteristics thereof such as a threshold value or the like.

Further, strictly speaking, offset gate regions are formed on both sides of the channel forming regions 134, 137 and 140 by film thicknesses of the anodically oxidized films 11, 12 and 13 having the dense film quality which has been formed in the step of FIG. 2(C). However, according to Embodiment 1, the film thicknesses of the anodically oxidized films 11, 12 and 13 are about 1000 Å and therefore, the illustration of the offset gate regions is omitted in the drawing.

Figure 4:
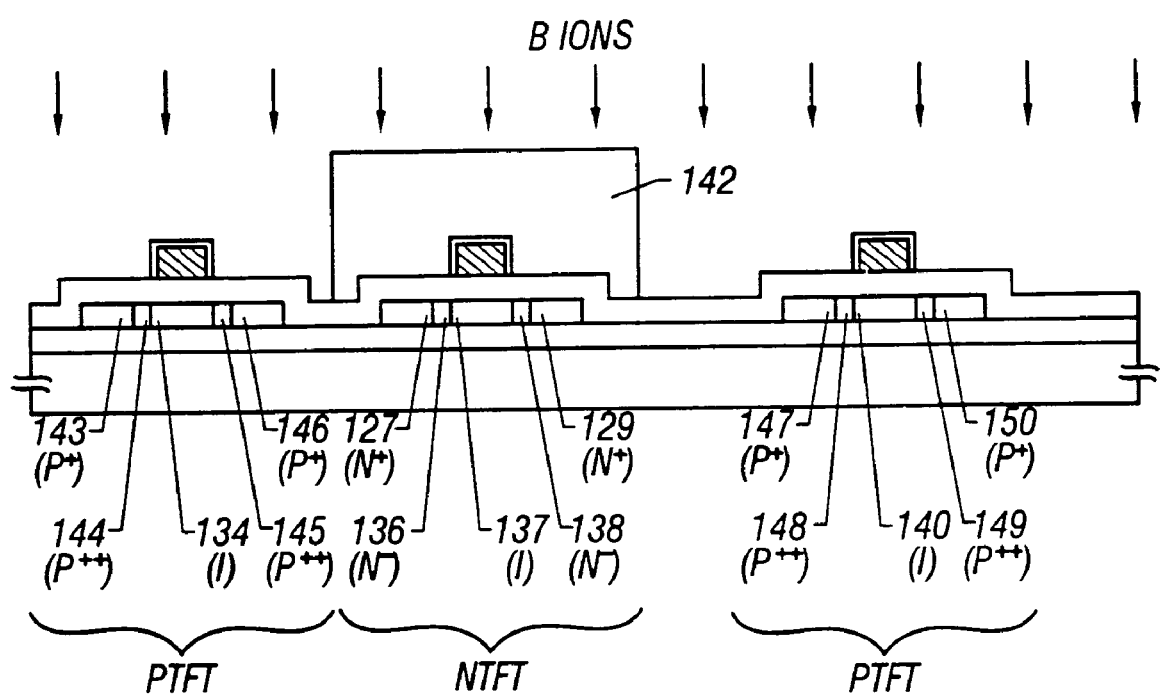
FIG. 4 is a view showing a step of simultaneously making an active matrix circuit and a peripheral drive circuit.

When the implantation of the impurity ions shown by FIG. 3(B) has been finished, a resist mask 142 is arranged as illustrated by FIG. 4 and implantation of boron ions is now carried out.

The conductive type of regions 143, 146, 147 and 150 is inverted from the N+ type one to a P+ type one by the implantation of boron ions. In other words, conditions for implanting boron ions are set such that the conductive type of the regions 143, 146, 147 and 150 is inverted from the N+ type one to the P+ type one. Here, the amount of doze of boron ions is set to $2 \times 10^{15}/cm^2$. Further, the acceleration voltage is set to 60 kV.

The conductive type of regions 144, 145, 148 and 149 is inverted from a N− type to a P++ type one by conducting the implantation of boron ions.

When attention is paid to the regions 143 and 144, the amounts of boron ions (amounts of doze) implanted (added) to the both regions 143 and 144 are substantially the same. That is, the concentrations of boron element in the both regions 143 and 144 are substantially the same.

However, the region 143 is provided with the N+-type behavior before implanting boron ions and the region 144 is provided with the N−-type behavior before implanting boron ions. Accordingly, the ratios of boron element contributing to neutralization of phosphorous element providing the N-type behavior are different from each other in the two regions.

That is, even if the amounts of doze of boron ions are the same, the ratios of boron element contributing to the inversion to the P-type behavior are different from each other. Accordingly, the region 144 is provided with the P-type behavior more potential than that of the region 143 (represented by P++-type behavior).

Here, the potentiality (strength) of the P-type behavior is designated by P+ and P++. Incidentally, the difference of the behavior between the N+-type region 127 and the N−-type region 136, has different meaning from that of the difference of the behavior between the P+-type region and the P++-type region since the difference of the former is caused by the difference of amounts of doze of phosphorous ions providing the N-type behavior.

After the implantation of boron ions shown by FIG. 4 has been finished, the resist mask 142 is removed. Further, the regions implanted with the impurity ions are annealed and the implanted impurity ions are activated by irradiating KrF excimer laser onto the total of the surface.

Figure 5A:
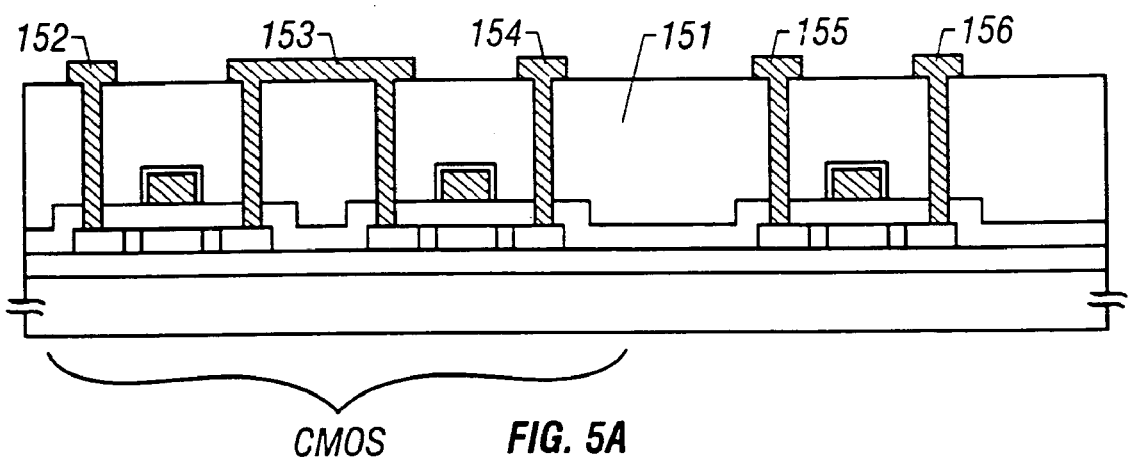
FIGS. 5(A) and 5(B) are views showing steps of simultaneously making an active matrix circuit and a peripheral drive circuit.
Figure 5B:
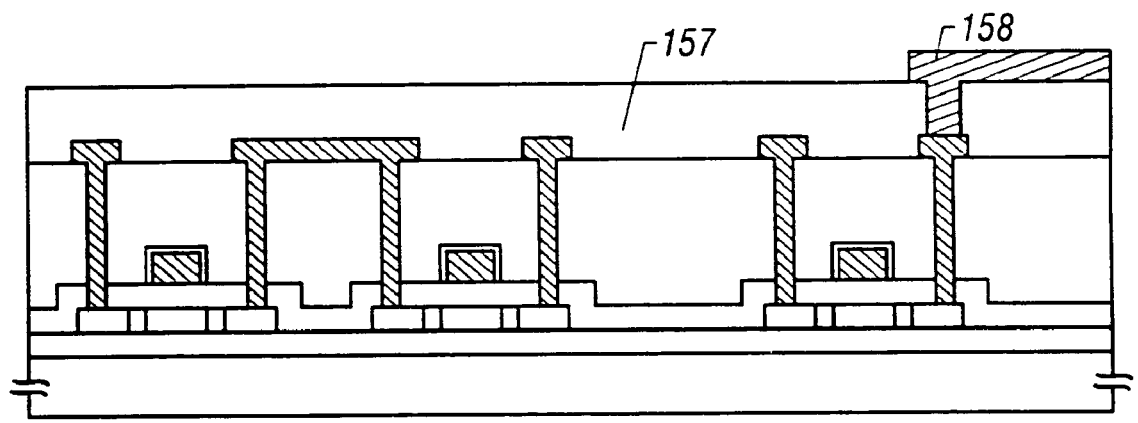

Next, an interlayer insulating film 151 is formed as shown by FIG. 5(A). The interlayer insulating film 151 is constituted by a silicon oxide film. Other than the silicon oxide film, a laminated film of silicon nitride films and silicon oxide films or a laminated film of silicon oxide films, silicon nitride films and resin films may be used.

When the interlayer insulating film 151 has been formed, formation of contact holes is carried out. Then, a source electrode 152 and a drain electrode 153 of the P-channel type thin film transistor and the drain electrode 153 and a source electrode 154 of the N-channel type thin film transistor are formed.

In this way the CMOS circuit constituted by a complimentary type of the P-channel type thin film transistor and the N-channel type thin film transistor is completed. Simultaneously, a source electrode 155 (generally provided by extending from source wirings arranged in a matrix) and a drain electrode 156 are formed whereby the thin film transistor at the pixel matrix portion is completed.

When the state illustrated by FIG. 5(A) is provided, a second interlayer insulating film 157 is formed. Next, contact holes are formed by which a pixel electrode 158 made of ITO (Indium Tin Oxide) is formed.

Next, a heating treatment is carried out at 350° C. for 1 hour in a hydrogen atmosphere by which the effects in the active layers are repaired. In this way, the constitution where the active matrix circuit (pixel matrix circuit) and the peripheral drive circuit are simultaneously arranged, is obtained.

According to the constitution disclosed in Embodiment 1, as shown by FIG. 4, the P-channel type thin film transistor is constituted by the source region comprising the P+-region, the impurity region having the P-type behavior more potential than that of the source region comprising the P++-region, the channel forming region, the impurity region having the P-type behavior more potential than that of the drain region comprising the P++-region and the drain region comprising the P+ region in this order.

That is, the P-channel type thin film transistors are provided with the constitution where the impurity regions having the P-type behavior more potential than that of the drain regions are arranged between the channel forming regions and the drain regions.

Meanwhile, the N-channel type thin film transistors are constituted by the source region comprising the N+-region, the low concentration impurity region comprising the N−-region, the channel forming region, the low concentration impurity region comprising the N−-region and the drain region comprising the N+-region in this order.

That is, the N-channel type thin film transistor is provided with the constitution where the low concentration impurity region is arranged between the channel forming region and the drain region. The low concentration impurity region arranged between the channel forming region and the drain region is generally referred to as an LDD (Light Dope Drain) region.

Figure 6A:
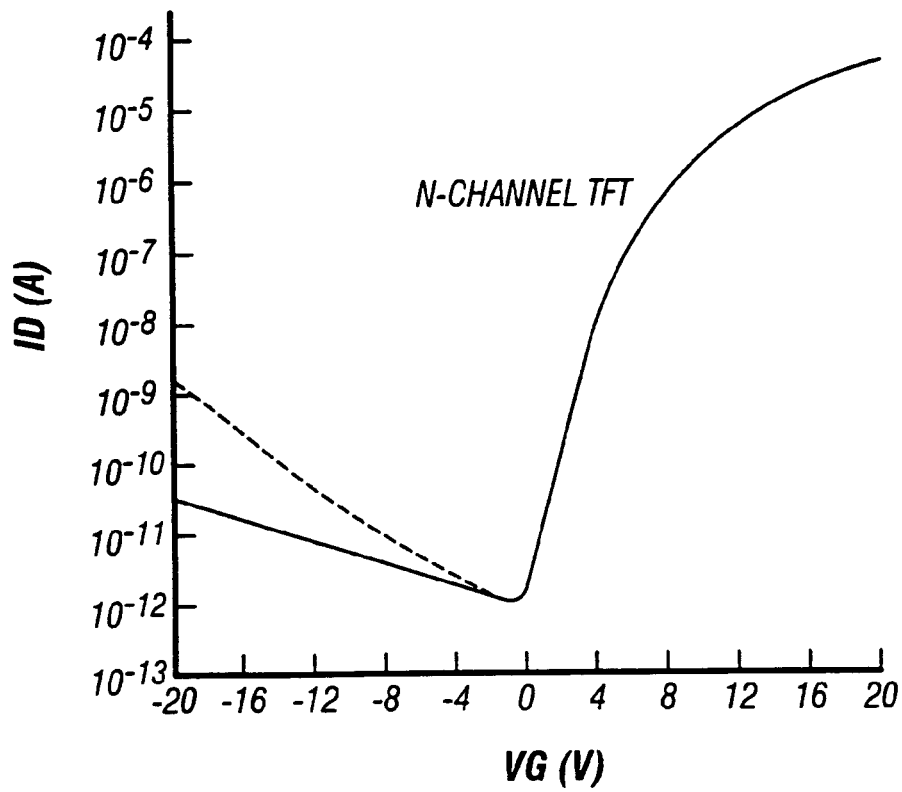
FIG. 6 illustrates diagrams showing characteristics of a P-channel type and an N-channel type thin film transistor.
Figure 6B:
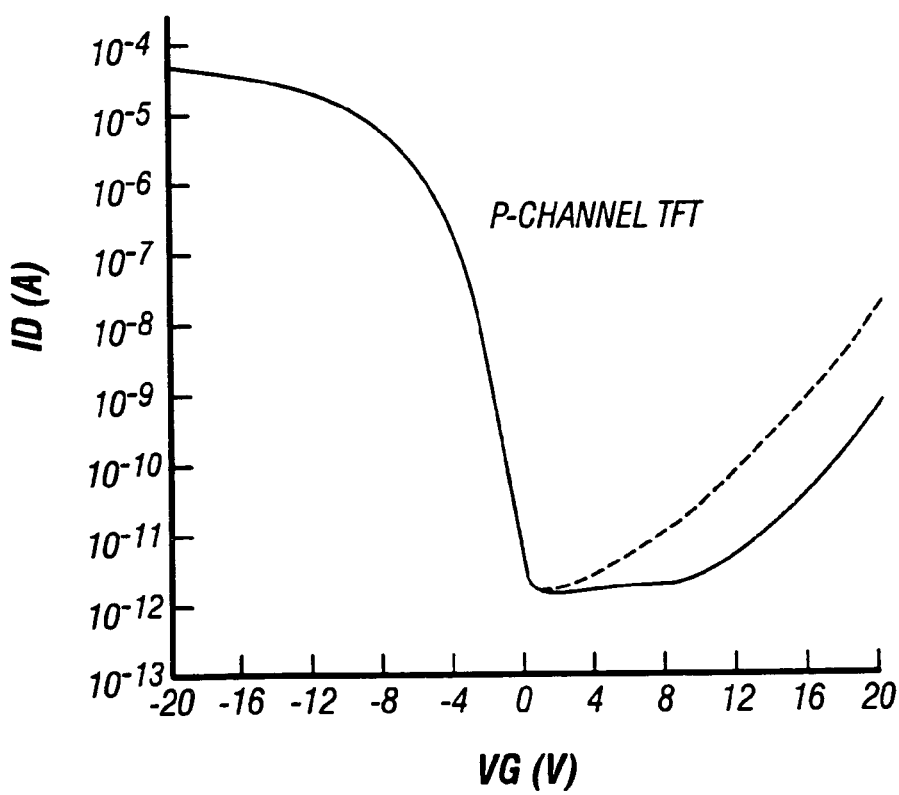

FIG. 6 shows the characteristic of the P-channel type thin film transistor per se and the characteristic of the N-channel type thin film transistor per se formed by the fabrication steps of Embodiment 1.

Bold lines in FIG. 6 indicate the characteristics of the P-channel type and the N-channel type thin film transistors formed by the fabrication steps of Embodiment 1. Further, dotted lines of FIG. 6 indicate the characteristics of thin film transistors having no impurity regions provided with LDD regions or potential P-type behaviors which are shown for comparison.

As is apparent from FIG. 6, the N-channel type thin film transistor is provided with a low OFF current characteristic since the LDD region is arranged.

Meanwhile, also the P-channel type thin film transistor is provided with a comparatively low OFF current characteristic. It is conceivable that the P-channel type thin film transistor is effective since the impurity region having the potential P-type behavior (region having the P-type behavior more potential than that of the drain region) is provided between the channel forming region and the drain region.

Because the structural difference of the invented P-channel type thin film transistor from the normal P-channel type thin film transistor of which characteristic is shown by the dotted line, resides in the difference therebetween in respect of the arrangement of the impurity regions having the potential P-type behavior as designated by numerals 144, 145, 148 and 149.

Currently, a detailed mechanism of the operation of the impurity regions having the potential P-type behavior (designated by numerals 144, 145, 148 and 149 in FIG. 4) is unknown. However, according to the knowledge of the inventors the mechanism seems to be based on the operational state inherent to the P-channel type thin film transistor.

Incidentally, as is apparent by observing FIG. 6, the OFF current characteristic of the P-channel type thin film transistor designated by the bold line is quite singular. That is, in respect of a rise of the OFF current value, it does not increase linearly and gradually as that in the N-type channel one but rises from a certain domain. This characteristic seems to be caused by the existence of the impurity regions having the potential P-type behavior (designated by numerals 144, 145, 148 and 149 of FIG. 4).

According to Embodiment 1, when the P-channel type and the N-channel type thin film transistors are integrated on a same substrate, the N-channel type thin film transistor is provided with the low OFF current characteristic by arranging the LDD regions and the P-channel type thin film transistor is provided with the low OFF current characteristic by arranging the impurity regions having the P-type behavior more potential than that of the drain region.

The low concentration impurity regions (numerals 136 and 138 of FIG. 4) arranged in the N-channel type thin film transistor, function effectively in restraining deterioration by hot carriers. Furthermore, the N-channel type thin film transistor is provided also with the operation where the resistance between the source and the drain is increased whereby the mobility is lowered substantially, by the presence of the low concentration impurity regions.

Meanwhile, the P-channel type thin film transistor can be constituted such that the lowering of the mobility is not resulted since there is no portion of increasing the resistance between the source and the drain as in the LDD region.

These operations are effective for correcting the difference of the characteristics between the P-channel type thin film transistor and the N-channel type thin film transistor.

That is, the characteristic of the N-channel type thin film transistor can be approached to the characteristic of the P-channel type thin film transistor which is hardly deteriorated by hot carriers and which is provided with mobility smaller than that of the N-channel type thin film transistor.

In this way, the constitutions of the P-channel type thin film transistor and the N-channel type thin film transistor both of which are provided with the low OFF current characteristic and where the difference in the characteristics of the both thin film transistors is corrected, can be realized.

According to the constitution in Embodiment 1, the P-channel type thin film transistor is arranged in the pixel matrix region. The P-channel type thin film transistor is provided with the characteristic shown by the bold line in the lower diagram of FIG. 6.

The P-channel type thin film transistor having such a characteristic is characterized in the rise of the OFF current value. That is, the P-channel type thin film transistor is provided with a singular characteristic where the OFF current value hardly increases until the gate voltage becomes 8 V.

Generally, in the actual operation of the pixel matrix, the thin film transistor is used within a range where the OFF current value hardly increases.

Therefore, the P-channel type thin film transistor where the OFF current value increases from a certain location illustrated by lower diagram of FIG. 6 is used more effectively as the thin film transistor arranged in the pixel matrix region than the N-channel type thin film transistor where the OFF current value gradually increases as illustrated by the upper diagram of FIG. 6.

Embodiment 2

Embodiment 2 concerns an example where offset gate regions are arranged in the N-channel type thin film transistor instead of the LDD region in the constitution shown by Embodiment 1.

According to Embodiment 2, the light doping step shown by FIG. 3(B) is not carried out. Thereby, the regions 133, 135, 136, 138, 139 and 141 can stay as substantially intrinsic regions.

Further, in the state illustrated by FIG. 4, the regions 136 and 138 can be made the offset gate regions. The dimensions of the offset gate regions can be adjusted by the thickness of the porous anodically oxidized film 119 that is formed by the step of FIG. 3(A).

An effect similar to that in the case where the low concentration impurity regions are provided can be achieved by providing the offset gate regions. That is, in the N-channel type thin film transistor, the electric field intensity between the channel forming region and the drain region can be alleviated whereby effects of restraining deterioration caused by hot carriers and reducing the OFF current value can be achieved.

Embodiment 3

In Embodiment 3, the thicknesses of the anodically oxidized films having the dense film quality designated by numerals 11, 12 and 13 which are formed in the step of FIG. 2(C) are made substantially 2500 Å or more. Thereby, offset gate regions can be formed in active layers directly therebelow.

The fabrication steps of Embodiment 3 are substantially the same as the fabrication steps shown by FIG. 1(A) through FIG. 5(B). According to Embodiment 3, the film thicknesses of the anodically oxidized films 11, 12 and 13 having the dense film quality illustrated by FIG. 2(C) at side faces of the gate electrodes 121, 122 and 123 are made substantially 2500 Å or more.

In order to make the film thicknesses of the anodically oxidized films 11 through 13 substantially 2500 Å or more, the applied voltage in the anodic oxidation is increased. Although control of the film thicknesses is dependent also on the concentration or the temperature of solution, the control can be carried out generally by the applied voltage.

When the film thicknesses of the anodically oxidized films 11, 12 and 13 are made as thick as about 2500 Å or more, regions where the doping of the impurity ions is not conducted are formed on the both sides of the channel forming regions 134, 137 and 140 of FIG. 4 in accordance with the film thicknesses.

These regions do not function substantially as the channel forming regions but achieve a function similar to those of the low concentration impurity regions 136 and 138.

When the constitution of Embodiment 3 is adopted, the offset gate regions can be arranged at all of the thin film transistors. Further, the OFF current characteristic can be improved in all of the thin film transistors.

For example, when the constitution of Embodiment 3 is used in the thin film transistors shown by the fabrication steps of FIG. 1(A) through FIG. 5(B), the P-channel type thin film transistor can be provided with the structure where both the potential P-type impurity region and the offset gate region are used and the N-channel type thin film transistor can be provided with the structure where both the low concentration impurity region (LDD region on the side of the drain region) and the offset gate region are used.

Embodiment 4

Embodiment 4 shows an example where the thin film transistor arranged in the pixel matrix region is the N-channel type thin film transistor having the LDD regions in the constitution shown by Embodiment 1.

The steps up to the step of FIG. 3(B) in Embodiment 4 are the same as those of Embodiment 1. Accordingly, an explanation of the steps up to the step of FIG. 3(B) will be omitted.

Figure 7:
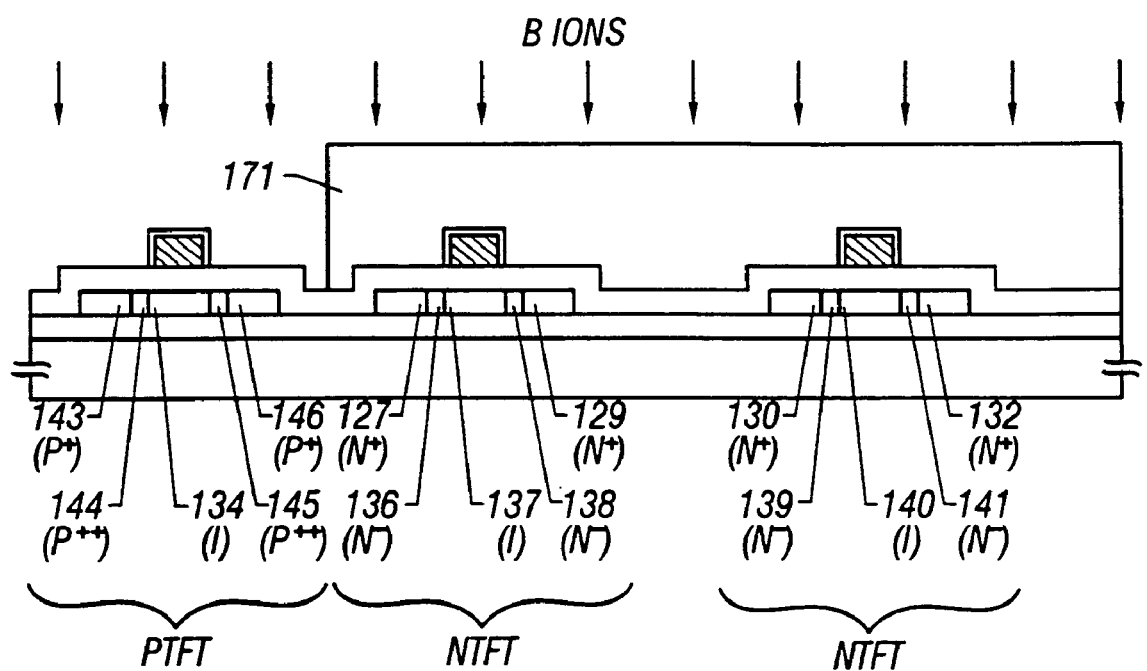
FIG. 7 is a view showing a step of simultaneously making an active matrix circuit and a peripheral drive circuit.

To realize the constitution shown by Embodiment 4, the state illustrated by FIG. 3(B) is firstly achieved. Next, the resist mask 171 is arranged as shown by FIG. 7. Next, boron ions are implanted.

As a result, the N+-type regions designated by numerals 124 and 126 and the N--type regions designated by numerals 133 and 135 in FIGS. 3(A) and 3(B) are inverted to P-type ones. Thereby, the P+-type regions designated by numerals 143 and 146 and the P++-type regions designated by numerals 144 and 145 in FIG. 7 are provided.

The P+-type regions are regions having the P-type behavior to a degree whereby they can be operated as the source and the drain regions.

The P++-type regions are regions having the P-type behavior more potential than that of the P+-type regions. That is, the P++-type regions are regions having the electric property as the P-type ones more potential than those of the P+-type regions.

When the implantation of boron ions has been finished, the resist mask 171 is removed and a laser beam is irradiated on the total of the surface.

In this way, the P-channel type thin film transistor and the N-channel type thin film transistors are formed separately on the same glass substrate.

Thereafter, the thin film transistors are completed after conducting steps similar to those of FIGS. 5 (A) and 5(B). According to the constitution of Embodiment 4, the thin film transistor arranged in the pixel matrix region becomes the N-channel type thin film transistor having the low concentration impurity regions (LDD regions).

With regard to the P-channel type thin film transistor, the P-channel type thin film transistor having the low OFF current characteristic can be constituted by arranging the impurity region having the P-type behavior more potential than that of the drain region between the channel forming region and the drain region.

The P-channel type thin film transistor can be formed simultaneously with the formation of the N-channel type thin film transistor having the low concentration impurity regions and the CMOS structure where the difference in the characteristics has been corrected can be realized.

Further, nonuniformity or obscureness of display caused by the OFF current value can be restrained by arranging the P-channel type thin film transistor in the pixel matrix region of the active matrix type display device.

The invention claimed is:

1. A semiconductor device comprising:
an underlayer film over a substrate;
a crystalline silicon film including a channel region, a drain region and an impurity region disposed between the channel region and the drain region over the underlayer film;
a gate insulating film over the crystalline silicon film;
a gate electrode covering the channel region on the gate insulating film, wherein the gate electrode does not cover the impurity region;
a first interlayer insulating film over the gate electrode;
a first contact hole in the gate insulating film and the first interlayer insulating film;
a second interlayer insulating film over the first interlayer insulating film; and
a second contact hole in the second interlayer insulating film,
wherein the drain region and the impurity region include an n-type impurity and a p-type impurity,
wherein a concentration of the n-type impurity included in the drain region is higher than a concentration of the n-type impurity included in the impurity region,
wherein a concentration of the p-type impurity included in the drain region is substantially the same as a concentration of the p-type impurity included in the impurity region, and
wherein a center of the first contact hole and a center of the second contact hole are substantially the same.

2. The semiconductor device according to claim 1, wherein the semiconductor device is a liquid crystal display device.

3. A semiconductor device comprising:
an underlayer film over a substrate;
a crystalline silicon film including a channel region, a drain region and an impurity region disposed between the channel region and the drain region over the underlayer film;
a gate insulating film over the crystalline silicon film;
a gate electrode covering the channel region on the gate insulating film, wherein the gate electrode does not cover the impurity region;
a first interlayer insulating film over the gate electrode;
a first contact hole in the gate insulating film and the first interlayer insulating film;
a second interlayer insulating film over the first interlayer insulating film; and
a second contact hole in the second interlayer insulating film,
wherein the drain region and the impurity region include an n-type impurity and a p-type impurity,
wherein a concentration of the n-type impurity included in the drain region is higher than a concentration of the n-type impurity included in the impurity region,
wherein a concentration of the p-type impurity region included in the drain region is substantially the same as a concentration of the p-type impurity included in the impurity region,
wherein a center of the first contact hole and a center of the second contact hole are substantially the same, and
wherein a diameter of the first contact hole and a diameter of the second contact hole are different.

4. The semiconductor device according to claim 3, wherein the semiconductor device is a liquid crystal display device.

5. A semiconductor device comprising:
a silicon oxide film as an underlayer film over a substrate;
a crystalline silicon film including a channel region, a drain region and an impurity region disposed between the channel region and the drain region over the underlayer film;
a gate insulating film over the crystalline silicon film;
a gate electrode covering the channel region on the gate insulating film, wherein the gate electrode does not cover the impurity region;
a first interlayer insulating film over the gate electrode;
a first contact hole in the gate insulating film and the first interlayer insulating film;

a second interlayer insulating film over the first interlayer insulating film; and a second contact hole in the second interlayer insulating film, wherein the drain region and the impurity region include an n-type impurity and a p-type impurity, wherein a concentration of the n-type impurity included in the drain region is higher than a concentration of the n-type impurity included in the impurity region, wherein a concentration of the p-type impurity included in the drain region is substantially the same as a concentration of the p-type impurity included in the impurity region, and wherein a center of the first contact hole and a center of the second contact hole are substantially the same.

6. The semiconductor device according to claim 5, wherein the semiconductor device is a liquid crystal display device.

7. A semiconductor device comprising:

an underlayer film over a substrate;

a crystalline silicon film including a channel region, a drain region and an impurity region disposed between the channel region and the drain region over the underlayer film;

a gate insulating film over the crystalline silicon film;

a gate electrode covering the channel region on the gate insulating film, wherein the gate electrode does not cover the impurity region;

a first interlayer insulating film comprising silicon oxide over the gate electrode;

a first contact hole in the gate insulating film and the first interlayer insulating film;

a second interlayer insulating film over the first interlayer insulating film; and a second contact hole in the second interlayer insulating film, wherein the drain region and the impurity region include an n-type impurity and a p-type impurity, wherein a concentration of the n-type impurity included in the drain region is higher than a concentration of the n-type impurity included in the impurity region, wherein a concentration of the p-type impurity included in the drain region is substantially the same as a concentration of the p-type impurity included in the impurity region, and wherein a center of the first contact hole and a center of the second contact hole are substantially the same.

8. The semiconductor device according to claim 7, wherein the semiconductor device is a liquid crystal display device.

9. A semiconductor device comprising:

an underlayer film over a substrate;

a crystalline silicon film including a channel region, a drain region and an impurity region disposed between the channel region and the drain region over the underlayer film;

a gate insulating film over the crystalline silicon film;

a gate electrode covering the channel region on the gate insulating film, wherein the gate electrode does not cover the impurity region;

a silicon nitride film over the gate electrode;

a silicon oxide film on the silicon nitride film;

a first contact hole in the gate insulating film, the silicon nitride film and the silicon oxide film and;

an interlayer insulating film over the silicon oxide film; and a second contact hole in the interlayer insulating film, wherein the drain region and the impurity region include an n-type impurity and a p-type impurity, wherein a concentration of the n-type impurity included in the drain region is higher than a concentration of the n-type impurity included in the impurity region, wherein a concentration of the p-type impurity included in the drain is substantially the same as a concentration of the p-type impurity included in the impurity region, and wherein a center of the first contact hole and a center of the second contact hole are substantially the same.

10. The semiconductor device according to claim 9, wherein the semiconductor device is a liquid crystal display device.

* * * * *

UNITED STATES PATENT AND TRADEMARK OFFICE
CERTIFICATE OF CORRECTION

| | |
|---|---|
| PATENT NO. | : 7,335,950 B2 |
| APPLICATION NO. | : 10/959981 |
| DATED | : February 26, 2008 |
| INVENTOR(S) | : Hongyong Zhang and Satoshi Teramoto |

It is certified that error appears in the above-identified patent and that said Letters Patent is hereby corrected as shown below:

In the Claims:

Col. 14, Claim 3, line 23, delete the word "region".

Signed and Sealed this

Fifth Day of August, 2008

JON W. DUDAS
*Director of the United States Patent and Trademark Office*